United States Patent
Hu et al.

(10) Patent No.: US 9,455,297 B2
(45) Date of Patent: Sep. 27, 2016

(54) PREPARATION PROCESS OF IMAGE SENSORS

(71) Applicant: Wuhan Xinxin Semiconductor Manufacturing Co., Ltd., Hubei (CN)

(72) Inventors: Siping Hu, Hubei (CN); Jifeng Zhu, Hubei (CN); Sheng'an Xiao, Hubei (CN); Jinwen Dong, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 0 days.

(21) Appl. No.: 14/813,612

(22) Filed: Jul. 30, 2015

(65) Prior Publication Data
US 2016/0093663 A1    Mar. 31, 2016

(30) Foreign Application Priority Data
Sep. 30, 2014    (CN) .......................... 2014 1 0526463

(51) Int. Cl.
*H01L 21/302* (2006.01)
*H01L 27/146* (2006.01)

(52) U.S. Cl.
CPC ..... *H01L 27/14687* (2013.01); *H01L 27/1469* (2013.01); *H01L 27/14634* (2013.01); *H01L 27/14636* (2013.01)

(58) Field of Classification Search
CPC ................. H01L 27/14685; H01L 27/14621; H01L 27/1468
USPC ................. 438/424, 427, 691; 257/292, E31
See application file for complete search history.

(56) References Cited

U.S. PATENT DOCUMENTS

| | | | |
|---|---|---|---|
| 2008/0197388 A1* | 8/2008 | Park .................. | H01L 27/14603 257/292 |
| 2009/0090989 A1* | 4/2009 | Han .................. | H01L 27/14621 257/432 |

* cited by examiner

*Primary Examiner* — Duy Deo
*Assistant Examiner* — Maki Angadi
(74) *Attorney, Agent, or Firm* — SoCal IP Law Group LLP; Mark A. Goldstein

(57) ABSTRACT

The invention relates to the field of semiconductor, more particularly, to a preparation process of image sensors, comprising: Step S1, providing a semiconductor structure, a top of which is provided with a groove, and leads being formed in said groove, the top of said semiconductor structure and an exposed surface of said groove are covered with a first dielectric layer; Step S2: depositing a second dielectric layer covering the upper surface of said first dielectric layer and said leads and filling said groove; Step S3: performing a reversed-etching process to thin said second dielectric layer, and to form a convex structure on a surface of said second dielectric layer above the groove; Step S4: performing a planarization process to said second dielectric layer to improve surface evenness of said second dielectric layer after grinding by the convex structure.

9 Claims, 4 Drawing Sheets

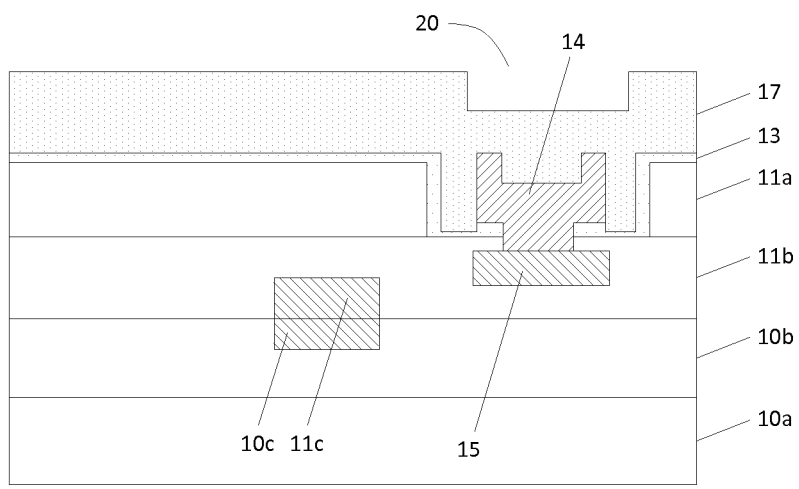
Figure 2b
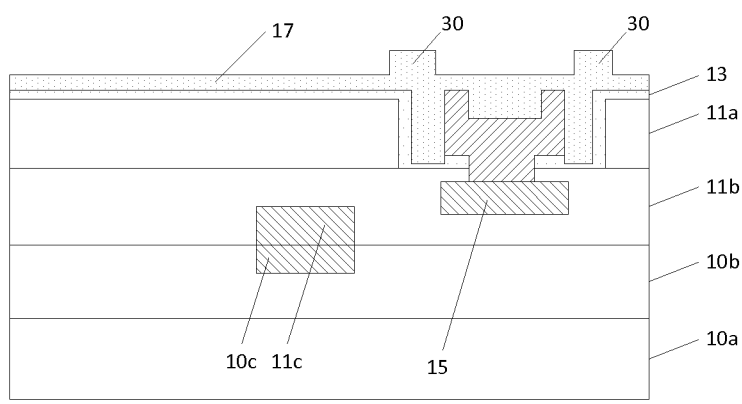
Figure 2c (1)

Figure 2c (2)

PREPARATION PROCESS OF IMAGE SENSORS

BACKGROUND OF THE INVENTION

1. Field of the Invention

The invention relates to the field of semiconductor, more particularly, to a preparation process of image sensors.

2. Description of the Related Art

CMOS image sensors belong to photoelectric components, CMOS image sensors gradually become the mainstream of the image sensor because of its manufacturing process compatible with integrated circuit fabrication process, and its performance has many advantages over the original charge-coupled device (CCD) image sensor. CMOS image sensors can integrate drive circuit and pixel together, which simplifies hardware design and reduces system power consumption. CMOS image sensors can also process image information in time due to it can remove the electrical signals while acquiring the optical signals, its speed is faster than a CCD image sensor, at the same time CMOS image sensors also have the advantages of cheap, large bandwidth, anti-blur, the flexibility of access and large filling coefficient, and get a lot of use, and are widely used in industrial automation and consumer electronics and other products, such as monitors, video communications and toys. Given the many advantages of CMOS image sensors, research and development of CIS now is to achieve versatility and intelligence using its system integration advantages, and achieve high frame rate CMOS through reading only a small interest area of photosensitive surface using its advantages of accessing flexibly, while the wide dynamic range, high resolution and low noise technology of CMOS image sensors is also in constant development.

The preparation process of image sensors in the current technology is shown in FIG. 1a~1b, firstly providing a semiconductor structure comprising first wafer 1 and second wafer 2, the first wafer comprises a substrate 1a and an oxide layer 1b, similarly the second wafer 2 comprises a substrate 2a and an oxide layer 2b; In addition, a groove is set in the top of the second wafer 2, and an electrode 4 is set in the groove, and the top of the substrate 2a and the exposed surface of the groove are covered with first electricity layer 3, its structure is shown in FIG. 1; then depositing a thicker second dielectric layer 5 covering the first dielectric layer 3 and filling the remaining portion of the groove, as shown in FIG. 2, and then flattening processing the second dielectric layer 5. However, those skilled in the field discover that after the flattening processing of the second dielectric layer 5, the thickness of the rest of the second dielectric layer 5 in different positions varies considerably. This is because the dielectric layer at the top of the groove will correspondingly form notches while depositing the second dielectric layer 5, so during the grinding, the grinding rate of the second dielectric layer 5 near the notches in general will be greater than the grinding rate of other locations, and then it is easy to produce dishing 6. Those skilled in the field don't expect to see the above problems.

SUMMARY OF THE INVENTION

The invention provides a method for preparing image sensors according to the deficiencies of the prior art, and comprising the steps of:

Step S1: providing a semiconductor structure, a top of which is provided with a groove, and leads being formed in said groove, the top of said semiconductor structure and an exposed surface of said groove are covered with a first dielectric layer;

Step S2: depositing a second dielectric layer covering the upper surface of said first dielectric layer and said leads and filling said groove;

Step S3: performing an reversed-etching process to thin said second dielectric layer, and to form a convex structure on a surface of said second dielectric layer above the groove;

Step S4: performing a planarization process to said second dielectric layer to improve surface evenness of said second dielectric layer after grinding by the convex structure.

Preparation process as described above, wherein said semiconductor structure comprises a first wafer and a second wafer bonded on the first wafer;

Said first wafer and said second wafer are respectively comprise a substrate and an oxide layer, and an interface between the oxide layers of said first wafer and second wafer is a bonding interface.

Preparation process as described above, wherein the oxide layers of said first wafer and second wafer are provided with at least a first metal layer therein, and the first metal layers of said first wafer and second wafer overlap and contact each other in a one to one way.

Preparation process as described above, wherein, a second metal layer is arranged in the substrate of said second wafer with a predetermined depth, and the second metal layer contacts with said leads.

Preparation process as described above, wherein said leads are T metal, and the leads have a notch opened at its top.

Preparation process as described above, wherein said second dielectric layer is silicon oxide.

Preparation process as described above, wherein the reversed-etch process includes lithography and dry etching processes.

Preparation process as described above, wherein said convex structure is located near the groove and/or on its top.

Preparation process as described above, wherein said planarization process is chemical mechanical polishing.

The invention accurately controls the endpoint of the planarization process and improves film uniformity and reduces costs by using the reversed-etching process, and thus can improve the image quality of the image sensors, and thus applied to mass production.

BRIEF DESCRIPTION OF THE DRAWINGS

By reading reference to the following detailed descriptions of the drawings to non-limiting embodiment, the invention and its features, shapes and advantages will become more apparent. The same numerals indicate the same parts throughout the drawings. The drawings have not drawn to scale, the emphasis is showing the spirit of the invention.

FIG. 2b is a schematic diagram of the deposition of the second dielectric layer of the invention;

FIGS. 2c (1) and 2c (2) are schematic diagrams of two embodiments after the reversed-etching process of the invention;

DETAILED DESCRIPTION

In the following description, numerous specific details are provided in order to provide a more thorough understanding of the invention. However, it is obvious to those skilled in the field that the invention can be carried out without one or more of these details. In other embodiments, the technical characteristics known in the field are not described in order to avoid confusion with the invention.

For a thorough understanding of the invention, the following description will provide detailed steps and structure in order to explain the technical proposal of the invention. Preferred embodiments of the invention are described in detail below, but in addition to these detailed descriptions, the invention also may have other embodiments.

The invention provides a preparation process of image sensors, specifically as follows.

Figure 2A:
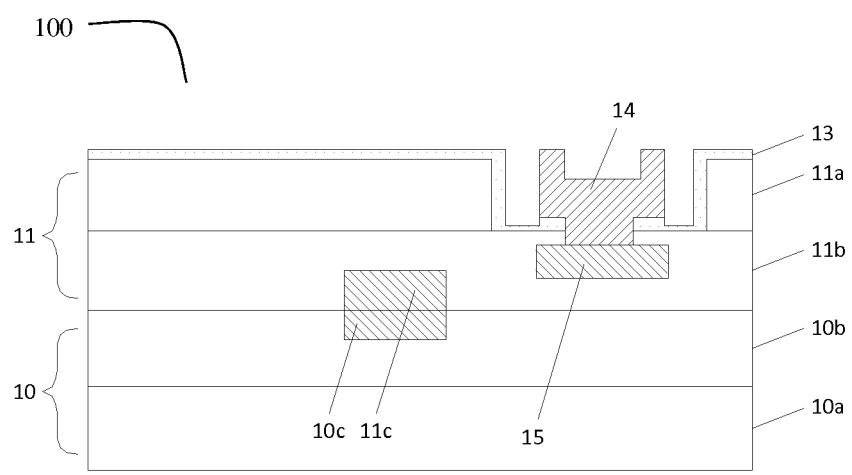
FIG. 2a is a schematic diagram of the semiconductor structure of the invention.
Figure 2D:
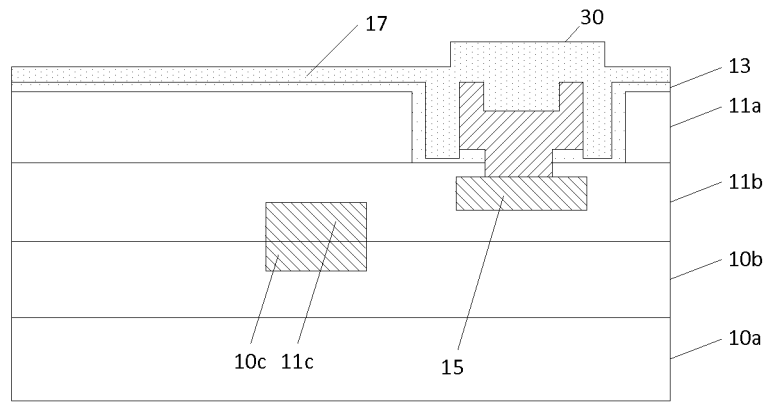
FIG. 2d is a schematic diagram after grinding process of the invention.
Figure 2D:
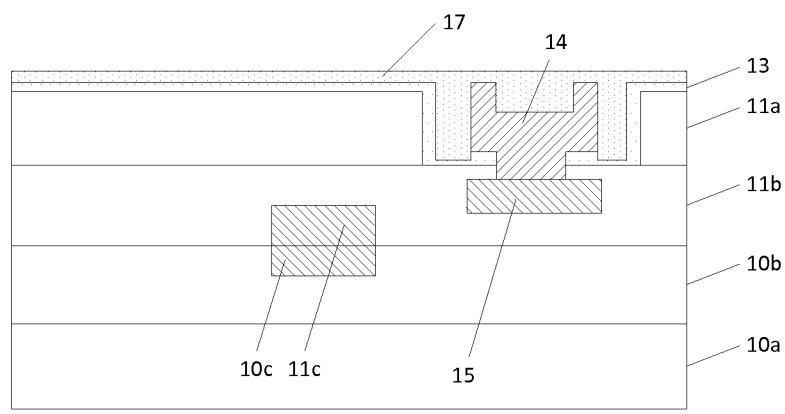

Step S1: firstly, providing a semiconductor structure 100 to prepare a CMOS image sensor. Referring to FIG. 2a, the top of which is provided with a groove, and leads 14 being formed in the groove, the top of the semiconductor structure 100 and an exposed surface of the groove are covered with a first dielectric layer 13, the first dielectric layer 13 spaces the leads 14 located above the bottom of the groove and the semiconductor structure 100, meanwhile the both sides of the leads 14 keep a certain gap between with the sidewall of the groove.

The semiconductor structure 100 will be described as follow: Continue to refer to FIG. 2a, the semiconductor structure 100 includes a first wafer 10 and the second wafer 11. The first wafer 10 includes a substrate 10a and an oxide layer 10b located above the substrate 10a; the second wafer 11 includes a substrate 11a and an oxide layer 11b located below the substrate 11a; adopt positive bonding process bonding the first wafer 10 and the second wafer 11 together, wherein the oxide layer 10b contacts with the oxide layer 11b.

The oxide layers of the first wafer 10 and second wafer 11 are provided with at least a first metal layer therein, and the first metal layers of the first wafer 10 and second wafer 11 overlap and contact each other in a one to one way. The oxide layer 10b is provided with first metal layer 10c, the oxide layer 11b is provided with first metal layer 11c, the first metal layer 10c and the first metal layer 11c are in contact. Meanwhile, a second metal layer 15 is arranged in the substrate 11a of the second wafer 11 with a predetermined depth, the top surface of the second metal layer 15 locates below the upper surface of the substrate 11a and contacts to the leads 14 for lead-out of the electrode. At least one groove is set in the top of the second wafer 11, and electrode 14 is formed in the groove, the bottom of the electrode 14 and the second metal layer 15 are formed in contact.

The above structure is prepared by conventional technology means in the field, which are not detailed described in the invention, but this does not affect the scope of the invention.

Step S2: depositing a second dielectric layer 17 covering the upper surface of the first dielectric layer 13 and the leads 14 and filling the groove; as shown in FIG. 2b.

As an option, the second dielectric layer 17 is a silicon oxide film having a thickness much thicker compared to the first dielectric layer 15. After the depositing of the second dielectric layer 17, as a result of the existence of the groove on the top of the second wafer 11, the deposited second dielectric layer 17 forms a notch 20 on top of the groove.

Step S3: performing a reversed-etching process to thin the second dielectric layer 17, and to form a convex structure 30 on a surface of the second dielectric layer 17 above the groove.

Wherein, the reversed-etch process includes lithography and dry etching process, i.e., firstly preparing photoresist having an opening pattern by lithography, then etching to remove the second dielectric layer 17 below the opening using the photoresist as etching mask to form the convex structure 30. Specific lithography and dry etching processes are known in the field, which are not repeated in detail here.

Alternatively, the formed convex structure 30 may have a variety of forms. For example, in an alternative embodiment, after the reversed-etching of the second dielectric layer 17, some convexity structures 20 are formed on the surface of the second dielectric layer 17 above the groove, as shown in FIG. 2c (1); in another alternative embodiment, an integral convex structure 20 is formed on the surface of the second dielectric layer 17 above the groove, as shown in FIG. 2c (2). Those skilled in the field should appreciate that the above list of the convexity structure 20 does not constitute a limitation of the invention, other embodiments may have other shapes, the only guarantee is to ensure a second dielectric layer structure 30 is formed near the groove and/or on its top.

Step S4: performing a planarization process to the second dielectric layer 17 to improve surface evenness of the second dielectric layer 17 after grinding by the convex structure 30, and after the grinding process, the top surface of the second dielectric layer 17 keeps a certain distance with the first dielectric layer 13.

Figure 1A:
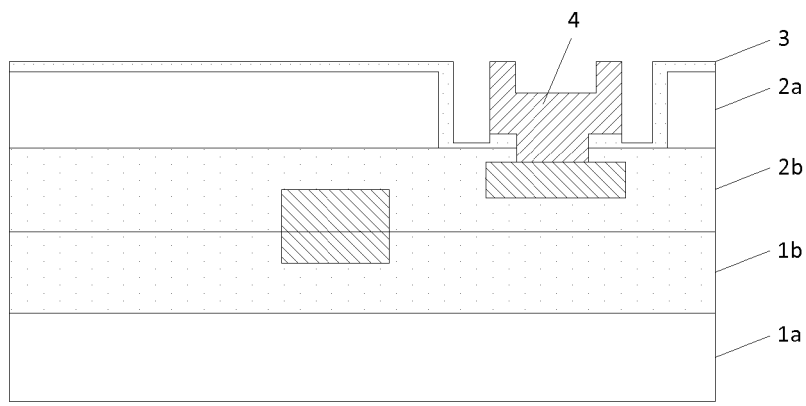
FIGS. 1a-1d are process flow diagrams of part of preparing image sensors in the current technology.
Figure 1B:
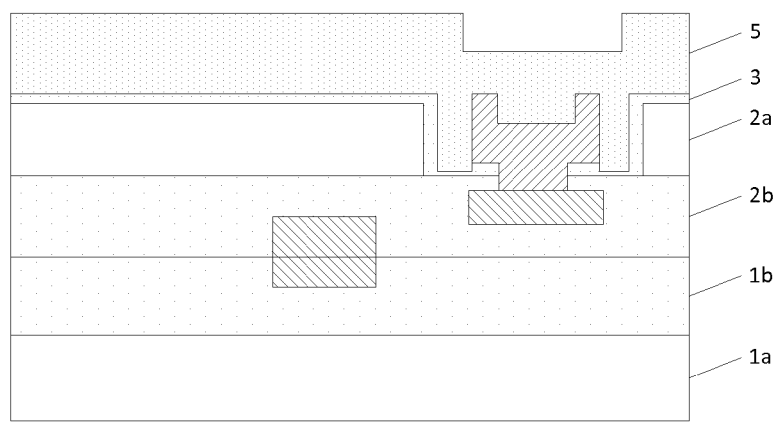
Figure 1C:
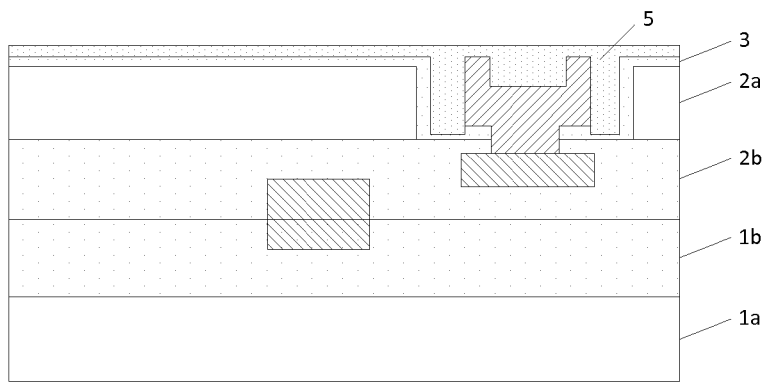
Figure 1D:
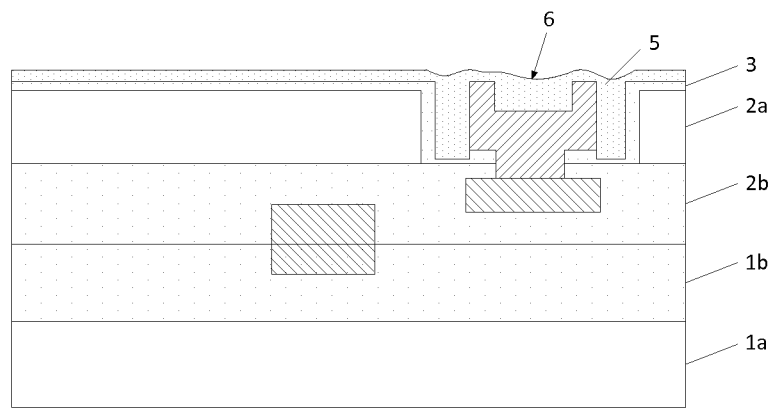

As an option, CMP (Chemical Mechanical Polishing) can be carried out to planarization process the second dielectric layer 17. In the conventional art, since the second dielectric layer 17 will form a notch 20 on the top of the groove, thus causes the grinding rate of the location greater than the grinding rate of other locations, it is easy to produce the phenomenon of over-polishing, formed in the case shown in FIG. 1d. The invention firstly etch the second dielectric layer 17 near the groove and/or on its top to form the convex structure 30, in the process of grinding, the height of the convex structure 30 higher than the height of other locations, which can play the role of a buffer in the process of grinding, and avoid forming defects because of the over grinding of the second dielectric layer 17 near the groove, which effectively improves the surface roughness of the second dielectric layer 17 after grinding.

Then, preparing metal fence, etching the second dielectric layer 17 to expose the opening of the leads 14, and filling color filters and other follow-up processes, the follow-up processes use known technology solutions, which do not repeat here.

In summary, the invention discloses a new process of landfill-type color filters combining with leads, which can be widely used in image sensors (such as front-illuminated, back-illuminated, stacked etc.) and field of semiconductor devices, before the planarization process on dielectric layer filled in the groove, firstly reversed-etching the dielectric layer to form a convex structure in the groove, and avoid forming the butterfly groove because of the grinding rate of the dielectric layer near the groove by the convex structures. The manufacture procedure of the invention changes little, and the implementation cost is low, and effectively improves the surface evenness of the dielectric layer after grinding, and provides a guarantee of improving image quality of image sensors.

More than better implementation examples of the invention are described. To be understood that the invention is not limited to the specific embodiment in which the device and structure not described in detail should be understood be carried out in the normal way; anyone technical personnel familiar with the field may use the above-mentioned method and technical content to make many possible changes and modification, or change to the equivalent implementation under the condition of not out of the scope of the technical scheme of the invention, and this does not affect the substance of the invention. Therefore, any content without departing from the technical scheme of the invention, any simple modification, equivalent change and modify to the above examples based on the technology of the invention, are still belongs to the scope of the invention.

What is claimed is:

1. A preparation process of image sensors, comprising:
   Step S1: providing a semiconductor structure, a top of which is provided with a trench configured with wire leads, the top of said semiconductor structure and an exposed surface of said trench covered with a first dielectric layer;
   Step S2: depositing a second dielectric layer covering an upper surface of said first dielectric layer and said wire leads and filling said trench;
   Step S3: performing a reversed etching process to thin said second dielectric layer and to form a convex structure on a surface of said second dielectric layer above the trench;
   Step S4: performing a planarization process on said second dielectric layer, wherein by virtue of the convex structure, surface evenness of said second dielectric layer is improved.

2. The preparation process as claimed in claim 1, wherein said semiconductor structure comprises a first wafer and a second wafer bonded on the first wafer;
   said first wafer and said second wafer are respectively comprise a substrate and an oxide layer, and an interface between the oxide layers of said first wafer and second wafer is a bonding interface.

3. The preparation process as claimed in claim 2, wherein the oxide layers of said first wafer and second wafer are provided with at least a first metal layer therein, and the first metal layers of said first wafer and second wafer overlap and contact each other.

4. The preparation process as claimed in claim 2, wherein a second metal layer is arranged in the substrate of said second wafer with a predetermined depth, and the second metal layer contacts said wire leads.

5. The preparation process as claimed in claim 1, wherein said wire leads are T-shaped metal, and the wire leads have a groove opened at its top.

6. The preparation process as claimed in claim 1, wherein said second dielectric layer is silicon oxide.

7. The preparation process as claimed in claim 1, wherein the reversed etch process includes lithography and dry etching processes.

8. The preparation process as claimed in claim 1, wherein said convex structure is located near the trench and/or on its top.

9. The preparation process as claimed in claim 1, wherein said planarization process is chemical mechanical polishing.

* * * * *